(12) United States Patent
Agostini et al.

(10) Patent No.: US 12,156,378 B2
(45) Date of Patent: Nov. 26, 2024

(54) VAPOR CHAMBER FOR COOLING AN ELECTRONIC COMPONENT, ELECTRONIC ARRANGEMENT, AND METHOD FOR MANUFACTURING THE VAPOR CHAMBER

(71) Applicant: ABB Schweiz AG, Baden (CH)

(72) Inventors: Bruno Agostini, Zürich (CH); Daniele Torresin, Baden (CH); Andrey Petrov, Zürich (CH)

(73) Assignee: ABB Schweiz AG, Baden (CH)

( * ) Notice: Subject to any disclaimer, the term of this patent is extended or adjusted under 35 U.S.C. 154(b) by 363 days.

(21) Appl. No.: 17/551,736

(22) Filed: Dec. 15, 2021

(65) Prior Publication Data
US 2022/0192050 A1    Jun. 16, 2022

(30) Foreign Application Priority Data
Dec. 16, 2020    (EP) .................................. 20214671

(51) Int. Cl.
*H05K 7/20* (2006.01)
*F28D 15/02* (2006.01)

(52) U.S. Cl.
CPC ........... *H05K 7/2039* (2013.01); *F28D 15/02* (2013.01)

(58) Field of Classification Search
CPC .. H05K 7/20336; H05K 7/20327; H05K 7/20; H05K 7/20309; H05K 7/20318; H05K 7/2039; H05K 7/2029; F28D 15/0233; F28D 15/04; F28D 15/043; F28D 15/0266; F28D 15/046; F28D 15/02
See application file for complete search history.

(56) References Cited

U.S. PATENT DOCUMENTS

| | | | |
|---|---|---|---|
| 6,901,994 B1 * | 6/2005 | Jin-Cherng | F28D 15/046 165/185 |
| 11,013,145 B1 * | 5/2021 | Naito | F28D 15/046 |

(Continued)

FOREIGN PATENT DOCUMENTS

| | | |
|---|---|---|
| CN | 202025742 U | 11/2011 |
| CN | 104748597 A | 7/2015 |

(Continued)

OTHER PUBLICATIONS

European Extended Search Report, Application No. 20214671.8, dated May 14, 2021, 7 pps.

(Continued)

*Primary Examiner* — Adam B Dravininkas
(74) *Attorney, Agent, or Firm* — McCarter & English, LLP (57) ABSTRACT

A vapor chamber includes a bottom cover, a top cover, a crate element, and at least one porous pillar. The bottom cover is configured to receive waste heat from an electronic component. The top cover is arranged on the bottom cover, and the bottom cover and the top cover are formed such that a vapor cavity configured to accommodate a liquid is formed between the bottom and top cover. The crate element is configured to provide mechanical strength to the vapor chamber, and has at least one compartment. The compartment(s) are formed by at least three side panels that are connected to each other, where the at least three side panels extend from the bottom cover to the top cover. The porous pillar(s) are configured to transfer the liquid from the top cover to the bottom cover and are arranged in the compartment.

14 Claims, 5 Drawing Sheets

(56) References Cited

U.S. PATENT DOCUMENTS

| | | | |
|---|---|---|---|
| 2007/0217154 A1* | 9/2007 | Lai | H01L 23/427 |
| | | | 257/E23.088 |
| 2008/0029249 A1 | 2/2008 | Hsiao | |
| 2009/0040726 A1 | 2/2009 | Hoffman et al. | |
| 2009/0260785 A1 | 10/2009 | Wang et al. | |
| 2010/0065255 A1* | 3/2010 | Liu | F28D 15/046 |
| | | | 165/104.33 |
| 2010/0071879 A1* | 3/2010 | Hou | F28D 15/046 |
| | | | 29/890.032 |
| 2017/0023308 A1* | 1/2017 | Huang | F28F 3/00 |
| 2017/0122672 A1* | 5/2017 | Lin | B23K 35/00 |
| 2017/0153066 A1* | 6/2017 | Lin | F28D 15/046 |
| 2019/0027424 A1 | 1/2019 | Mira et al. | |
| 2019/0249938 A1 | 8/2019 | Huang et al. | |
| 2020/0256623 A1* | 8/2020 | Kojima | F28D 15/0233 |
| 2021/0085831 A1* | 3/2021 | Morgan | A61L 31/041 |

FOREIGN PATENT DOCUMENTS

| | | |
|---|---|---|
| CN | 211656729 U | 10/2020 |
| DE | 202016103024 U1 | 7/2016 |

OTHER PUBLICATIONS

Chinese Office Action for Application No. 202111527862.6, dated Aug. 22, 2024, 21 pages.

* cited by examiner

VAPOR CHAMBER FOR COOLING AN ELECTRONIC COMPONENT, ELECTRONIC ARRANGEMENT, AND METHOD FOR MANUFACTURING THE VAPOR CHAMBER

CROSS REFERENCE TO RELATED APPLICATIONS

This patent application claims the benefit and priority of European Patent Application No. 20214671.8 filed on Dec. 16, 2020, the disclosure of which is incorporated by reference herein in its entirety as part of the present application.

BACKGROUND

The disclosure relates to the field of heat-transfer devices. In particular, the disclosure relates to a vapor chamber for cooling an electronic component.

It is known in the art to arrange a vapor chamber accommodating a liquid on an electronic component such that heat, which is generated during operation of the electronic component, is dissipated from the electronic component to the vapor chamber. The thermal energy corresponding to the heat causes the liquid in the vapor chamber to become vaporized, wherein the energy is "stored" in the corresponding vapor is transferred from a hot side of the vapor chamber, which is connected to the electronic component, to the cold side of the vapor chamber. At the cold side the vapor condenses and transfers the stored energy as thermal energy to the cold side such that the cold side is heated, while the condensed liquid is transferred back to the hot side of the vapor chamber. The heat is dissipated to the surroundings at the outside of the cold side of the vapor chamber and in the result the electronic component is cooled very efficiently.

Conventional 2-dimensional vapor chambers are composed of a solid top cover, a solid bottom cover, a porous top wick structure, a porous bottom wick structure, solid pillars, and annulus porous pillars. The top cover and the bottom cover form a vapor cavity, in which the porous top wick structure, the porous bottom wick structure, and the solid pillars are arranged. The porous top wick structure is arranged at the top cover and the porous bottom wick structure is arranged at the bottom cover. The solid pillars are embedded in and surrounded by the annulus porous pillars and these combined pillars are arranged in recesses of the wick structures such that the combined pillars extend from the bottom cover through the recesses to the top cover. The solid pillars are arranged for providing mechanical strength to the vapor chamber. The annulus porous pillars and the porous wick structures are provided for distributing the liquid in the vapor cavity.

Standard manufacturing methods for vapor chambers are e.g. powder sintering or diffusion bonding. These manufacturing methods allow the use of cylindrical and annulus pillars only, in order to be of economic value. This constraint has the shortcomings that the cylindrical solid pillars provide structural strength limited to the contact area with the solid covers only and that the annulus porous pillars provide a limited flow rate of the liquid from the cold side to the hot side due the high flow resistance of the corresponding porous structures. Therefore, the structural strength and the cooling efficiency of the vapor chamber are limited.

BRIEF DESCRIPTION

Embodiments of the present disclosure provide a vapor chamber for cooling an electronic component, having an improved structural strength and an improved cooling efficiency.

Another embodiment of the present disclosure provides an electronic arrangement which may be operated very efficiently.

Another embodiment of the present disclosure provides a method for manufacturing a vapor chamber for cooling an electronic component, which contributes to that that the vapor chamber has an improved structural strength and an improved cooling efficiency and that the vapor chamber may be manufactured at relative low costs.

These embodiments are achieved by the subject-matter of the independent claims. Further exemplary embodiments are evident from the dependent claims and the following description.

One aspect of the present disclosure provides a vapor chamber for cooling an electronic component. The vapor chamber includes a bottom cover for receiving waste heat from the electronic component, a top cover, which is arranged on the bottom cover, wherein the bottom cover and the top cover are formed such that a vapor cavity for accommodating a liquid is formed between the bottom cover and the top cover, a crate element for providing mechanical strength to the vapor chamber, wherein the crate element has at least one compartment, which is formed by at least three side panels being connected to each other and extending from the bottom cover to the top cover, and a top recess facing the top cover and a bottom recess facing the bottom cover, and at least one porous pillar for transferring the liquid from the top cover to the bottom cover, wherein the porous pillar is arranged in the compartment and extends from the bottom cover through the bottom recess and the top recess to the top cover.

The crate element and the porous pillar form a support structure of the vapor chamber. The crate element, in particular the side panels of the crate element enclosing the compartment, contribute to that that a support area, in which the covers are supported by the support structure, can be made relative large compared to the prior art such that structural strength of the vapor chamber is improved. In addition, less material is necessary for forming the crate element than for forming the solid pillars of the prior art such that the crate element allows for a more optimal material utilization.

During normal usage of the vapor chamber a liquid is arranged in the vapor cavity of the vapor chamber. The vapor cavity may be sealed such that a fixed amount of the liquid stays in the vapor cavity. Alternatively, the vapor chamber may include an intake and/or a drain communicating with the vapor cavity for exchanging the liquid.

When the vapor chamber is used to cool the electronic component, the vapor chamber may be arranged on the electronic component, with the bottom cover being in thermal contact with the electronic component. In this context, the vapor chamber may be referred to as heat-transfer device. When heat is generated by the electronic component and is dissipated to the bottom cover of the vapor chamber, the temperature of the bottom cover is increased such that the bottom cover forms the hot side of the vapor chamber. Then, the liquid in the vapor cavity gets vaporized by the thermal energy of the heat, wherein the thermal energy is "stored" in the vapor because of its aggregation state. The vapor transfers the energy from the hot side of the vapor chamber to the cold side of the vapor chamber, i.e. the top cover. In particular, the vapor transfers the energy to the top cover of the vapor chamber while its aggregation state changes again, wherein the vapor condenses at least in part, and the corresponding the liquid is lead back to the hot side, i.e. the bottom cover, at least in part by the porous pillars. In particular, the purpose of the porous pillars is to ensure a homogeneous flow of the liquid throughout the vapor chamber and to provide the capillary pumping necessary to keep the internal fluid circulation independently of gravity.

A cross section of the crate element may be circular or polygonal, e.g. triangle-shaped, rectangle-shaped, square-shaped, etc. In this description, the term "cross section" always refers to a cross section, which is parallel to the bottom or top cover and/or perpendicular to the extension of the porous pillars.

A cross section of the compartment may be polygonal, e.g. triangle-shaped, rectangle-shaped, square-shaped, etc.

A cross section of the porous pillar may be circular or polygonal, e.g. triangle-shaped, rectangle-shaped, square-shaped, etc.

According to one or more embodiments, a cross section area of the porous pillar is smaller than a cross section area of the compartment such that an open channel for guiding the liquid from the top cover to the bottom cover is formed between the porous pillar and at least one of the side panels of the compartment. The open channel contributes to a very efficient transfer of the liquid from the hot side to the cold side of the vapor chamber. In other words, the purpose of this empty open channel is to allow a free circulation of the liquid from the cold to the hot side of the vapor chamber. This allows an increased flow rate of the liquid, i.e. a high permeability, compared to the prior art, because the pressure drop through the empty open channel is negligible compared to that through the porous pillars.

According to one or more embodiments, the porous pillar is arranged at least one of the side panels. In particular, the porous pillar may be in direct contact with the corresponding side panel. For example, one edge or side surface of the porous pillar is fixedly connected to an inner wall of the compartment of the crate element, i.e. the surface of the corresponding side panel facing the porous pillar. More than one side of the porous pillar may be in direct contact with the crate element, e.g. two or three sides. The arrangement of the porous pillar directly at the crate element provides mechanical strength to the porous pillar and the crate element and therefore contributes to the improved mechanical strength of the vapor chamber.

According to one or more embodiments, the compartment is formed by at least four side panels. Therefore, the compartment may have a rectangular, e.g. square, cross section. The compartment is formed by five or more side panels such that e.g. a honeycombed structure is formed. This may contribute to a very efficient use of space inside the vapor chamber.

According to one or more embodiments, at least one of the side panels has a side recess. For example, each side panel may have a side recess. The side recesses may be referred to as through cut-outs and/or may be formed polygonal, e.g. prism-shaped, or circular. These recesses decrease the material needed for the crate element and as such for the support structure and the vapor chamber, improve an overall mechanical resistance and decrease the weight of the support structure and as such of the vapor chamber.

According to one or more embodiments, the porous pillar has a polygonal cross section parallel to the bottom or top cover. For example, the porous pillar may have a square or rectangular cross section such that each side surface of the porous pillar facing a corresponding one of the side panels of the crate element may be plane. This contributes to a proper coupling of the porous pillar to the crate element, if the porous pillar, in particular at least one of its side surfaces, is directly attached to one or more of the side panels.

According to one or more embodiments, the crate element includes an array of corresponding compartments, wherein adjacent compartments share at least one of their side panels, and wherein at least one corresponding porous pillar is arranged in each of the compartments. The array of compartments contributes to that that the mechanical strength of the support structure and as such of the vapor chamber is further increased. The corresponding array of porous pillars contributes to that that the flow of the liquid in the vapor cavity is further enhanced leading to a more efficient heat dissipation and cooling efficiency of the vapor chamber.

According to one or more embodiments, the vapor chamber includes an array of corresponding crate elements, with corresponding porous pillars being arranged in the corresponding compartments. The array of crate elements contributes to that that the mechanical strength of the vapor chamber is further increased. The corresponding arrays of porous pillars contribute to that that the flow of the liquid in the vapor cavity is further enhanced leading to a more efficient heat dissipation and cooling efficiency of the vapor chamber.

According to one or more embodiments, the vapor chamber includes at least one perforated plate, which is parallel to the bottom cover or parallel to the top cover and which has at one plate recess for each crate element, with the crate element being arranged in and extending through the corresponding plate recess. The vapor chamber includes one perforated top plate being arranged at or next to the top cover and/or one perforated bottom plate being arranged at or next to the bottom cover. The perforated plate may be referred to as wick structure.

According to one or more embodiments, the top cover includes at least one top chamber extending in direction away from the bottom cover, the top chamber communicating with the vapor chamber. The top chamber may accommodate the vapor during cooling the electronic component and provides an increased surface for dissipating the heat to the surroundings. So, the top chamber contributes to a very high cooling efficiency of the vapor chamber.

According to one or more embodiments, the top cover includes at least two corresponding top chambers, wherein outer walls of the top chambers are connected to each other by at least one cooling rib. The cooling rib further increases the surface for dissipating the heat and therefore contributes to a very high cooling efficiency of the vapor chamber.

Another aspect of the present disclosure provides an electronic arrangement. The electronic arrangement includes the electronic component, which generates heat while being operated, and the above vapor chamber, with the bottom cover of the vapor chamber being in thermal contact with the electronic component for cooling the electronic component. It has to be understood that features, advantages, and/or embodiments of the vapor chamber as described above and in the following may be features, advantages, and/or embodiments of the electronic arrangement.

It has to be understood that features, advantages, and/or embodiments of the vapor chamber and/or electronic arrangement as described above and in the following may be features, advantages, and/or embodiments of the method as described in the following.

Another aspect of the present disclosure provides a method for manufacturing a vapor chamber for cooling an electronic component. The method includes the steps of providing the bottom cover for receiving waste heat from the electronic component, forming the crate element for providing mechanical strength to the vapor chamber on the bottom cover by additive manufacturing using a first energy input, wherein the crate element has the at least one compartment, which is formed by the at least three side panels connected to each other and which has the top recess and the bottom recess, which faces the bottom cover, forming the at least one porous pillar on the bottom cover in the compartment by additive manufacturing using a second energy input, wherein the first energy input is greater than the second energy input, and providing the top cover on the bottom cover, the crate element, and the porous pillar such that the vapor cavity for accommodating the liquid is formed between the bottom cover and the top cover, that the crate element and the porous pillar are arranged in the vapor cavity, and that the compartment and the porous pillar extend from the bottom cover to the top cover, with the top recess of the compartment facing the top cover.

Manufacturing the vapor chamber by additive manufacturing contributes to that that the vapor chamber may be formed in a simple and cost efficient way. Forming the crate element by using a first energy input and forming the porous pillars by using a second energy input, wherein the first energy input is greater than the second energy input, enables to provide the solid structure of the crate element and the porous structure of the porous pillars in a simple way, simultaneously and/or in the same process.

One or more embodiments of the present disclosure provide the bottom cover by forming the bottom cover by additive manufacturing. Manufacturing the bottom cover by additive manufacturing contributes to that that the bottom cover and as such the vapor chamber may be formed in a simple and cost efficient way. Further, the bottom cover and the support structure may be formed during the same additive manufacturing process such that the support structure may be integrally formed with the bottom cover. This contributes to that that the support structure may be fixedly secured at the bottom cover and does not have to be fixed to the bottom cover in a separate process. This contributes to a very high mechanical strength of the vapor chamber and to a fast and simple manufacturing of the vapor chamber.

One or more embodiments of the present disclosure provide the top cover by forming the top cover by additive manufacturing. Manufacturing the top cover by additive manufacturing contributes to that that the top cover and as such the vapor chamber may be formed in a simple and cost efficient way. Further, the support structure and the top cover may be formed during the same additive manufacturing process such that the support structure may be integrally formed with the top cover. This contributes to that that the support structure may be fixedly secured at the top cover and does not have to be fixed to the top cover in a separate process. This contributes to a very high mechanical strength of the vapor chamber and to a fast and simple manufacturing of the vapor chamber.

The bottom cover, the top cover, and the support structure are formed by additive manufacturing, for example during the same additive manufacturing process. This contributes to a very high mechanical strength of the vapor chamber and to a fast and simple manufacturing of the vapor chamber.

These and other aspects of the disclosure will be apparent from and elucidated with reference to the embodiments described hereinafter.

BRIEF DESCRIPTION OF THE DRAWINGS

The subject matter of the disclosure will be explained in more detail in the following text with reference to exemplary embodiments which are illustrated in the attached drawings.

In the drawings, identical parts are provided with the same reference symbols in the figures.

DETAILED DESCRIPTION

Figure 1:
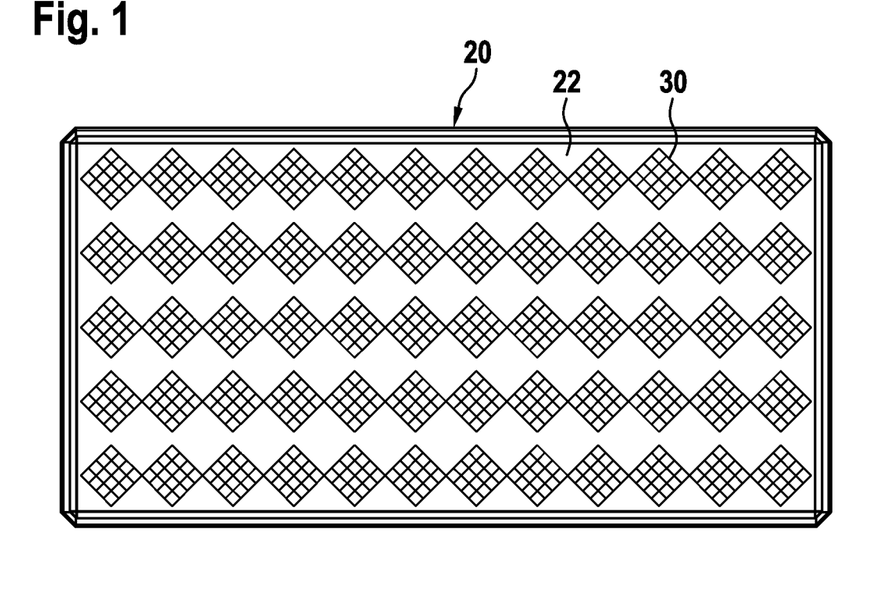
FIG. 1 is a schematic view of a top view of a bottom cover and support structures of a vapor chamber in accordance with one or more embodiments of the present disclosure.
Figure 2:
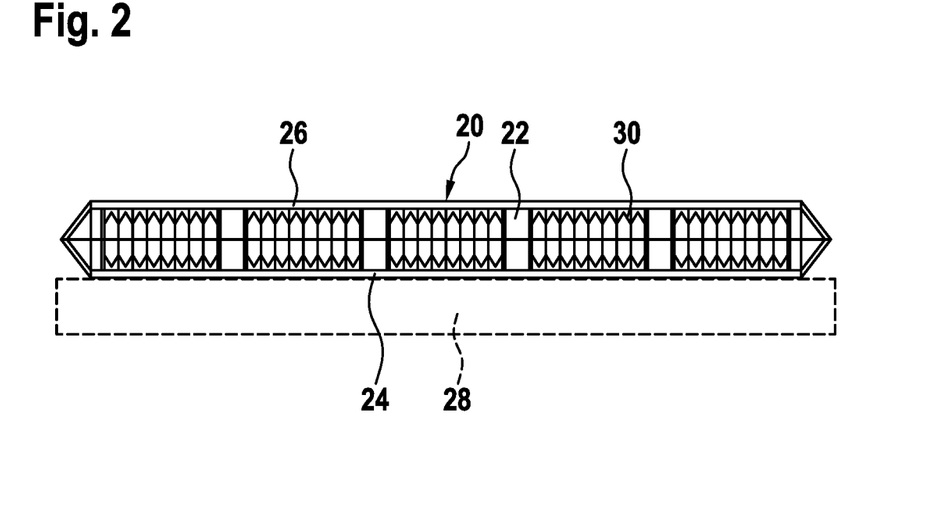
FIG. 2 is a schematic view of a sectional side view of the vapor chamber in accordance with FIG. 1.

FIG. 1 shows a top view of a bottom cover 24 of a vapor chamber 20 in accordance with one embodiment and FIG. 2 shows a sectional side view of the short side of the vapor chamber 20 shown in FIG. 1. The vapor chamber 20 of FIGS. 1 and 2 may be referred to as 2-dimensional vapor chamber 20 and/or as heat-transfer device.

The vapor chamber 20 includes the bottom cover 24, the top cover 26, and several support structures 30. The top cover 26 is arranged on the bottom cover 24 such that a vapor cavity 22 is formed between the top cover 26 and the bottom cover 24. During normal operation of the vapor chamber 20 a liquid is arranged in the vapor cavity 22. The vapor cavity 22 may be sealed such that a fixed amount of the liquid stays in the vapor cavity 22. Alternatively, the vapor chamber 20 may include an intake and/or a drain (not shown in the figures) communicating with the vapor cavity 22 for exchanging the liquid during operation.

The support structures 30 are arranged in the vapor cavity 22 and extend from the bottom cover 24 to the top cover 26. In the embodiment shown in FIG. 1, the support structures 30 are arranged in lines and columns, wherein adjacent lines are arranged such that the given distance is present between the lines corresponding lines.

The vapor chamber 20 may be used for cooling an electronic component 28, which generates heat during operation. For this purpose, the vapor chamber 20 is in thermal contact with the electronic component 28. In particular, the bottom cover 24 is in thermal contact with the electronic component 28. For example, the bottom cover 24 is directly attached to the electronic component 28. If the electronic component 28 generates heat, the heat is transferred to the vapor chamber 20 via the bottom cover 24. So, the bottom cover 24 may be referred to as warm side of the vapor chamber 20 and the top cover 26 may be referred to as cold side of the vapor chamber 20.

The thermal energy of the transferred heat causes a change of the aggregation state of the liquid in the vapor cavity 22 such that it is at least partly vaporized, wherein the corresponding energy is "stored" in the corresponding vapor as heat of vaporization. The vapor is distributed in the vapor cavity 22 and at least partly condenses at the inside of the top cover 26, releasing the stored energy, by changing its aggregation state again, to the top cover 26 facing away from the electronic component 28. The top cover 26 is correspondingly heated and may dissipate the heat to the surroundings of the vapor chamber 20. The condensed liquid flows back to the bottom cover 24 at least partly assisted by the support structures 30. In addition, the heat is transferred from the bottom cover 24 to the top cover 26 by the support structures 30, which are directly connected to the bottom cover 24 and to the top cover 26. So, the vapor chamber 20 dissipates the heat away from the electronic component 28 and as such cools the electronic component 28 very efficiently.

The embodiment shown in FIGS. 1 and 2 includes a given number of support structures 30, i.e. 60 support structures 30. However, there may be arranged more or less support structures 30 as shown in FIGS. 1 and 2. Further, the support structures 30 of FIGS. 1 and 2 are arranged in lines and columns, i.e. in 5 lines and 12 columns. However, there may be more or less lines and/or columns of corresponding support structures, and/or the support structures 30 may be arranged in a different pattern, for example including circular or arbitrary structures. Further, as can be seen from FIG. 1, each support structure 30 has a rectangular, in particular a square cross-section. Alternatively, the support structures 30 each may have another polygonal cross-section or a circular cross-section.

Figure 3:
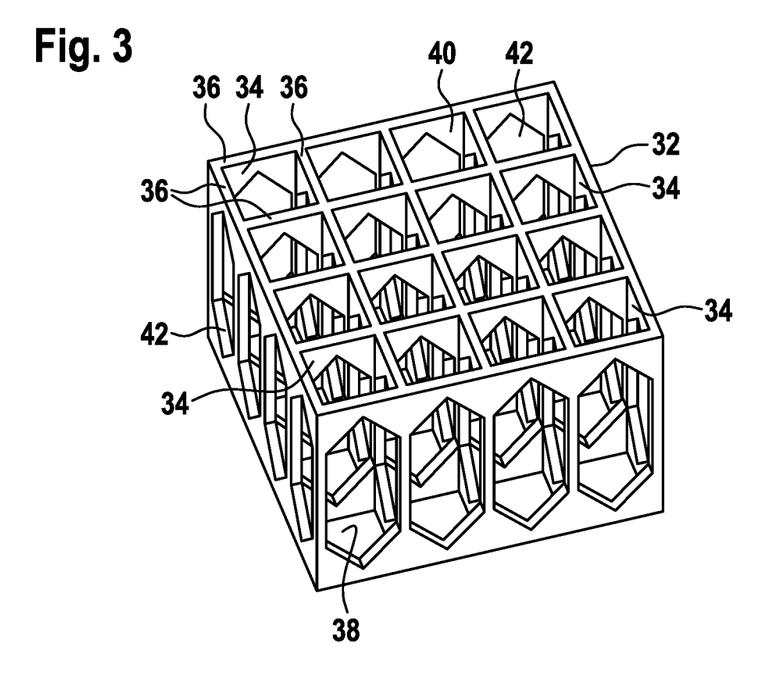
FIG. 3 is a schematic view of a perspective view of a crate element of the support structure of FIG. 1.

FIG. 3 shows a crate element 32 of one of the support structures 30 shown in FIG. 1 in accordance with one or more embodiments. The crate element 32 has several compartments 34, wherein each compartment 34 is formed by four side panels 36 and wherein adjacent compartments 34 share at least two of the side panels 36. In other words, some of the side panels 36 extend along two or more of the compartments 34 and/or contribute to form two or more of the compartments 34. Each compartment 34 has a bottom recess 38 and a top recess 40, facing away from the bottom recess 38. If the support structure 30 is arranged in the vapor cavity 22, the bottom recess 38 faces the bottom cover 24 and the top recess 40 faces the top cover 26. In addition, the side panels 36 are in direct contact with the bottom cover 24 at the side of the bottom recess 38, and the side panels 36 are in direct contact with the top cover 26 at the side of the top recess 40. Each of the side panels 36 has a corresponding side recess 42. A thickness of the side panels may be around 0.1 mm to 1 mm.

The crate element 32 has a square cross-section. Alternatively, the crate element 32 may have another rectangular or polygonal cross-section, or the crate element 32 may have a circular cross-section. The crate element 32 has four rows and four columns of four compartments 40 in each column and, respectively, row. Alternatively, the crate element 32 may have more or less rows and/or columns each having more or less compartments 40. Each compartment 40 is formed by four side panels 36 and has a square cross section. Alternatively, the compartments 40 may be formed by only three or more than four side panels 36 and as such may have a triangle, another rectangular, or polygonal cross-section. The bottom recesses 38 and the top recesses 40 are square-shaped for partly accommodating the porous pillars 50 (see FIG. 4). Alternatively, the bottom recess 38 and/or the top recess 40 may have another rectangular or polygonal cross-section, or the bottom recess 38 and/or the top recess 40 may have a circular cross-section. The side recesses 42 are prism-shaped. Alternatively, the side recesses 42 may have a rectangular, e.g. square, or polygonal shape, or the side recesses 42 may have a circular shape.

Figure 4:
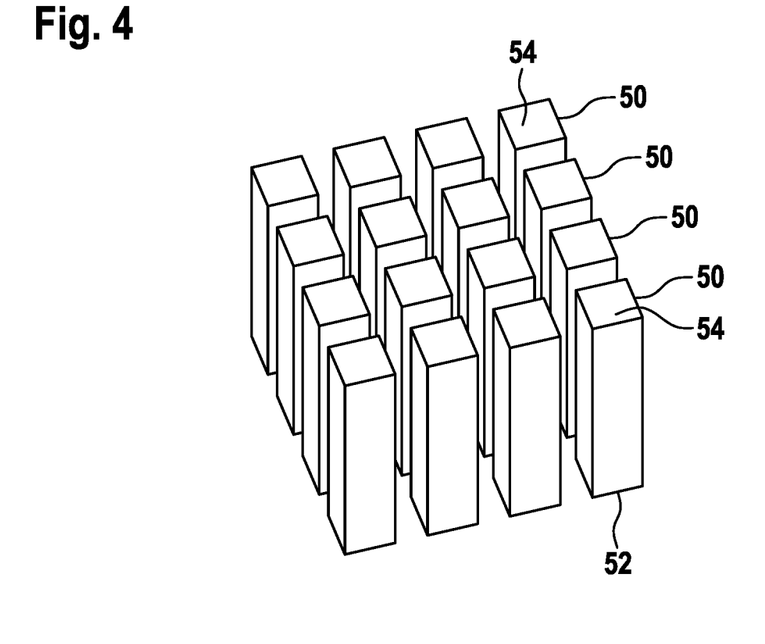
FIG. 4 is a schematic view of a perspective view of porous pillars of the support structure of FIG. 1.

FIG. 4 shows a perspective view of an array of porous pillars 50 of the support structure 30. Each of the porous pillars 50 includes a bottom surface 52 and a top surface 54, facing away from the bottom surface 52. If the porous pillars 50 are arranged in the vapor cavity 22, the porous pillars 50 extend from the bottom cover 24 to the top cover 26 and the bottom surfaces 52 are in direct contact with the bottom cover 24 and the top surfaces 54 are in direct contact with the top cover 26. The porous pillars 50 of the support structure 30 are formed such that at least a part of the liquid in the vapor cavity 22 may be transferred through the pores of the porous pillars 50.

The porous pillars 50 of the embodiment shown in FIG. 4 are cuboid-shaped, each having a square cross-section. Alternatively, the porous pillars 50 may be formed differently and may, for example, have rectangular, polygonal, or circular cross-sections. In the embodiment shown in FIG. 4, the array of porous pillars 50 has four rows and four columns of four porous pillars 50 in each column and, respectively, row. Alternatively, the array of porous pillars 50 may have more or less rows and/or columns each having more or less porous pillars 50.

Figure 5:
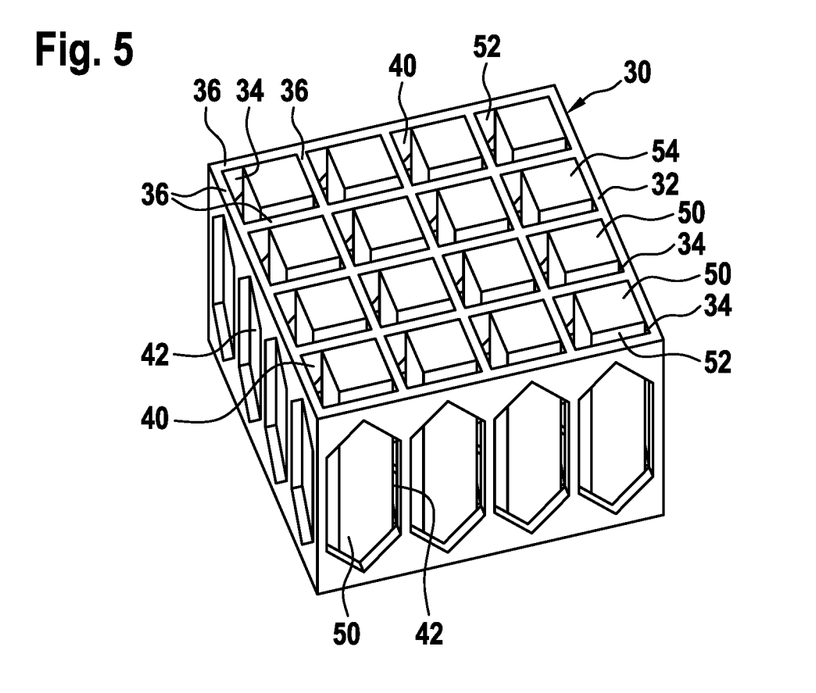
FIG. 5 is a schematic view of a perspective view of the support structure of FIG. 1.

FIG. 5 shows the support structure 30 including the crate element and the porous pillars 50. The porous pillars 50 are arranged in the compartments 40 of the crate element 32. In particular, each compartment 40 contains one of the porous pillars 50. The height of the porous pillars 50 is the same as the height of the crate element 32, in particular of the side panels 36. If the support structure 30 is arranged in the vapor cavity 22, the crate element 32, in particular the side panels 36, and the porous pillars 50 extend from the bottom cover 24 to the top cover 26 and are in direct contact with the bottom cover 24 and the top cover 26.

The porous pillars 50 are arranged in the compartments 40 such that two sides of each porous pillar 50 are in direct contact with at least one of the side panels 36. The cross-sections of the porous pillars 50 are smaller than the cross-sections of the corresponding compartments 40. Therefore, open channels for guiding the liquid from the cold side to the hot side of the vapor chamber 20 are formed between each of the porous pillars 50 and the corresponding side walls 36 of the corresponding compartment 40. The open channels may have an area of 0.1 mm to 0.5 mm times 1 mm, which may be around 10% to 50% times 100% of the cross-section of the porous pillars 50, wherein the cross-section is parallel to the bottom or top cover 24, 26.

The alternative embodiments of the crate element 32 and the porous pillars 50 as described above in connection with FIG. 3 and, respectively, 4 may be transferred to alternative embodiments of the support structure 30 including the crate element 32 and the porous pillars 50 as shown in FIG. 5. Therefore, a repetitive description of these alternatives is omitted in order to not to obscure the idea of the disclosure. In addition, alternatively, the porous pillars 50 may be arranged in the corresponding compartments 40 such that only one side or three sides of the porous pillars 50 are in direct contact with the corresponding side panels 36 of the corresponding compartments 40, wherein the open channels between the porous pillars 50 and the other side panel(s) 36 of the corresponding compartment 40 are modified accordingly. Further, in the embodiment shown in FIG. 5, each compartment 40 includes at least one porous pillar 50. Alternatively, some of the compartments 40 may not include any porous pillar 50 and/or some of the compartments 40 may include more than one porous pillar 50.

In an embodiment, the crate element 32 and the porous pillars 50 are made by additive manufacturing, wherein the crate element 32 is formed by a first energy input and the porous pillars 50 are formed by a second energy input smaller than the first energy input. The first energy input being greater than the second energy input contributes to that that a density of the material of the crate element 32 is larger than a density of the porous pillars 50. In other words, the different energy inputs by forming the crate element 32 and the porous pillars 50 leads to the fact that the material of the crate element 32 is more solid than that of the porous pillars 50, and that the material of the porous pillars 50 has pores, in contrast to the material of the crate element 32. The solid structure of the crate elements 32 contributes to the improved mechanical strength of the vapor chamber 20. The porous structure of the porous pillars 50 contributes to a very efficient distribution of the liquid in the vapor chamber 20 and as such to a very high cooling efficiency of the vapor chamber 20.

The crate element 32 and the porous pillars 50 may be produced at the same time, wherein, in this description, if one element is referred to as being formed "at the same time" as another element, the one element is formed "during the same process" and/or "by the same device without removing the one element" as the other element. For example, the crate element 32 and the porous pillars 50 may selectively be sintered from loose metal powder grains by additive manufacturing. Metal powder grains have a good heat conductivity. The grains may be made out of a metal material. The grains may be sintered together. The metal material may be a copper material or an aluminum material for example. The metal material may be an alloy. The crate element 32 and the porous pillars 50 may be sintered according to a CAD model. The porous pillars 50 are shaped three-dimensionally to optimize a pumping capability of the micro-porous and to optimize flow resistance in the macro-pores of the porous pillars.

According to the above embodiment, the crate elements 32 and the porous pillars 50 are connected to the bottom cover 24 and the top cover 26. In this context, the bottom cover 24 and the top cover 26 may be formed, e.g. sintered, integrally with the crate elements 32 and the porous pillars 50. The bottom cover 24 and the top cover 26 may be produced at the same time as the crate elements 32 and the porous pillars 50. By integrally connecting the bottom cover 24, the crate elements 32, the porous pillars 50, and the top cover 26 an optimum thermal connection may be achieved between the bottom cover 24, the crate elements 32, the porous pillars 50, and the top cover 26. Further, by integrally connecting the bottom cover 24, the crate elements 32, the porous pillars 50, and the top cover 26 an optimum mechanical strength of the vapor chamber 20 may be achieved.

Figure 6:
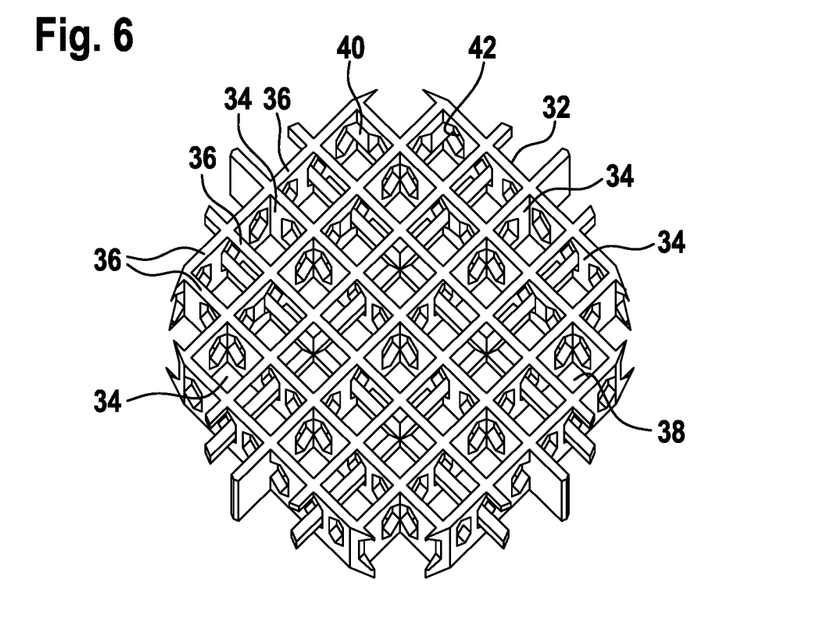
FIG. 6 is a schematic view of a perspective view of another crate element in accordance with one or more embodiments of the present disclosure.

FIG. 6 shows an alternative embodiment of the crate element 32. The circumference of the cross-section of the crate element 32 parallel to the bottom cover 24 or top cover 26 is circular. For example, the crate element 32 has been formed out of one piece of several connected crate elements 32 and has been separated from the other crate elements 32 afterwards, e.g. by cutting or sawing along a circular line. This may contribute to a simple and cost effective manufacturing of the crate element 32.

Figure 7:
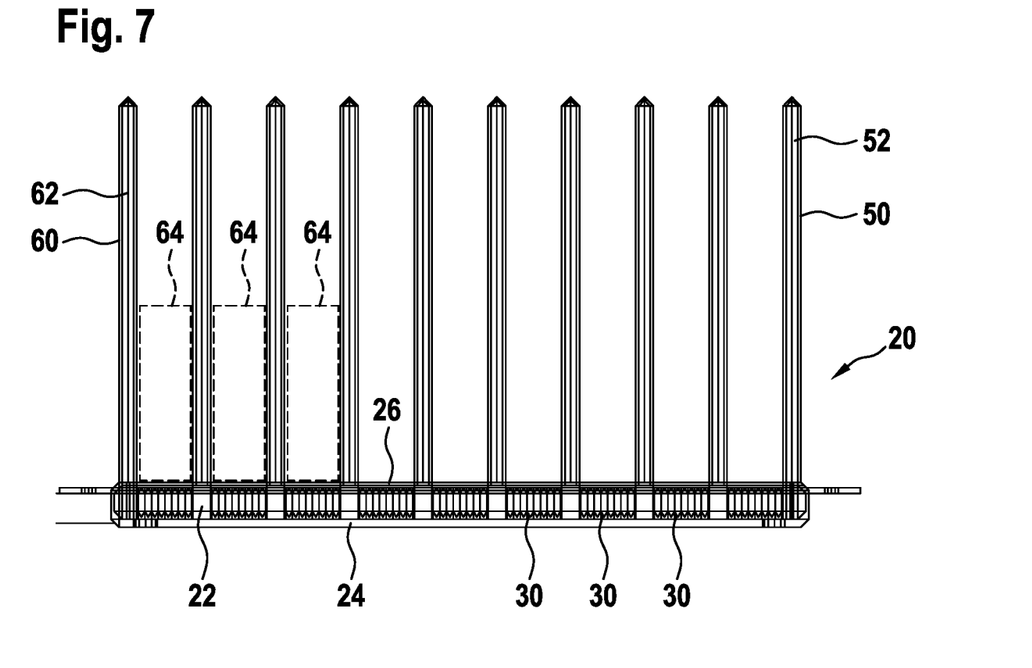
FIG. 7 is a schematic view of a sectional side view of another vapor chamber in accordance with one or more embodiments of the present disclosure.

FIG. 7 shows a sectional side view of an alternative embodiment of the vapor chamber 20. The vapor chamber 20 may be referred to as a 3-dimensional vapor chamber 20. The vapor chamber 20 includes top chambers 60, each of which including one top cavity 62. The top cavities 62 communicate with the vapor cavity 22 for exchanging liquid and/or vapor. The top chambers 60 increase the outer surface of the vapor chamber 20 and as such the cooling capacity of the vapor chamber 20 compared to the vapor chamber 20 without the top chambers 60. Cooling ribs 64 connect adjacent top chambers 64 for further increasing the outer surface of the vapor chamber 20 and as such the cooling capacity of the vapor chamber 20.

The embodiment of the vapor chamber 20 shown in FIG. 7 has ten top chambers 60 and three cooling ribs 64. Alternatively, the vapor chamber 20 may include more or less of the top chambers 60. Further, more or less of the top chambers 60 may be connected by corresponding cooling ribs 64. For example, at least one cooling rib 64 may be arranged between two adjacent ones of the top chambers 60. Further, there may be arranged two or more cooling ribs 64 next to each other between each pair of the top chambers 60.

Figure 8:
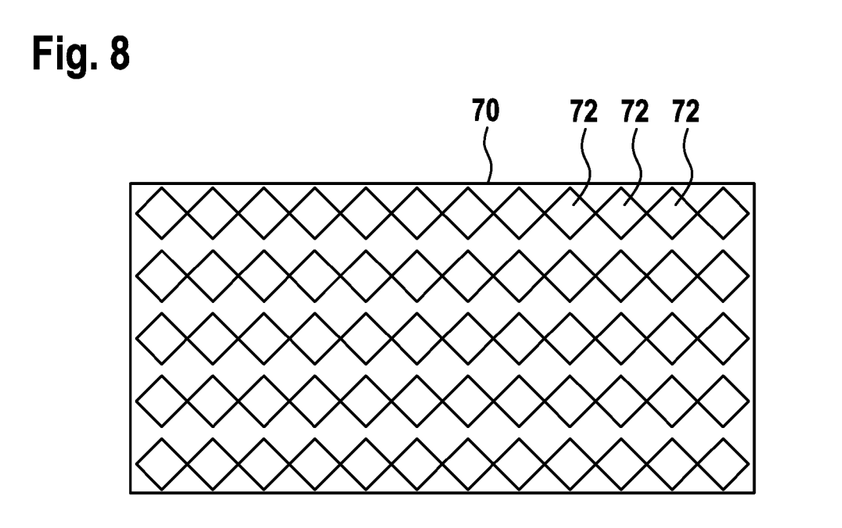
FIG. 8 is a schematic view of a top view of a perforated plate of a vapor chamber in accordance with one or more embodiments of the present disclosure.

FIG. 8 shows an embodiment of a perforated plate 70. The perforated plate 70 may be referred to as a wick structure. The perforated plate 70 includes several plate recesses 72. The plate recesses 72 are formed and arranged such that the perforated plate 70 may be arranged on the bottom cover 24 of the vapor chamber 20 of FIG. 1 and that the support structures 30 are arranged in the plate recesses 72 and extend through the plate recesses 72. With respect to the alternative embodiments of the vapor chamber 20 and the support structures 30 as explained above in context with FIGS. 1 and 2, the perforated plate 70 and in particular the plate recesses 72 may be modified accordingly. For example, if there are more or less of the support structures 30, the perforated plate 70 may correspondingly include more or less plate recesses 72. Alternatively or additionally, if the support structures 30 have another cross-section area, e.g. a circular cross-section area, the plate recesses 72 may be adapted accordingly, e.g. such that they are circular.

The perforated plate 70 may support the vapor chamber 20 and/or the support structures 30. Therefore, the perforated plate 70 may contribute to the mechanical strength of the vapor chamber 20. Alternatively or additionally, if the perforated plate 70 is made of a porous material, the perforated plate 70 may contribute to the distribution of the liquid in the vapor cavity 22. The perforated plate 70 arranged on the bottom cover 24 may be referred to as perforated bottom plate. Alternatively or additionally, another perforated plate 70 may be arranged at the top cover 26 of the vapor chamber 20, which may be referred to as perforated top plate. The perforated bottom and/or top plate may be formed of the same material as the bottom cover 24, the crate elements 30, the porous pillars 50, and/or the top cover 26. The perforated bottom and/or top plate may be formed by additive manufacturing, for example at the same time as the bottom cover 24, the support structures 30, and/or the top cover 26.

Figure 9:
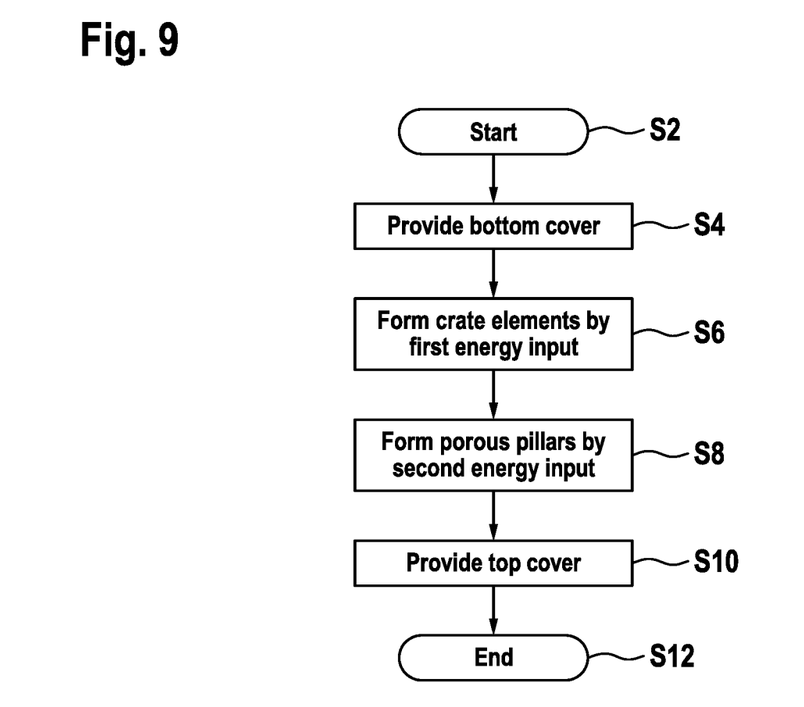
FIG. 9 is a flow chart of a method for manufacturing a vapor chamber in accordance with one or more embodiments of the present disclosure.

FIG. 9 shows a flow chart of an embodiment of a method for manufacturing a vapor chamber for cooling an electronic component, e.g. the vapor chamber 20 for cooling the electronic component 28 as explained in accordance with one of the above embodiments of the present disclosure.

In step S2 a manufacturing of a vapor chamber, e.g. the vapor chamber 20, is prepared and started. For example, in step S2 the materials for manufacturing the vapor chamber 20 are prepared and/or a software, a structural design, e.g. a CAD-file, and/or corresponding parameters are loaded into a device for manufacturing the vapor chamber. The device may be a 3D-printer.

In step S4 a bottom cover, e.g. the above bottom cover 24, is provided. The bottom cover 24 may be provided by forming the bottom cover 24 by additive manufacturing. If the bottom cover 24 is formed by additive manufacturing, the bottom cover 24 may be formed at the same time and/or integrally with the crate elements 30 and/or the porous pillars 50. A perforated plate, e.g. the perforated plate 70, e.g. the perforated bottom plate, may be formed on the bottom cover 24.

In step S6 crate elements, e.g. the above crate elements 30, are formed on the bottom cover 24. The crate elements 30 are formed by additive manufacturing using a first energy input. The first energy input causes the material of the crate elements 30 as being solid without any pores.

In step S8 porous pillars, e.g. the above porous pillars 50, are formed in compartments of the crate elements, e.g. in the compartments 40 of the crate elements 32. The porous pillars 50 are formed by additive manufacturing using a second energy input, wherein the first energy input is greater than the second energy input. The second energy input causes the material of the porous pillars 50 as being porous while having micro- and/or macro-pores. The porous pillars 50 may be formed at the same time and/or integrally with the corresponding crate element 32.

Step S8 may be carried out before step S6, or steps S6 and S8 are carried out at the same time. For example, the crate element 32 and the porous pillars 50 may be produced at the same time. For example, the crate element 32 and the porous pillars 50 may selectively be sintered from loose metal powder grains by additive manufacturing. Metal powder grains have a good heat conductivity. The grains may be made out of a metal material. The grains may be sintered together. The metal material may be a copper material or an aluminum material for example. The metal material may be an alloy. The crate element 32 and the porous pillars 50 may be sintered according to a CAD model represented by the CAD-file. The porous pillars 50 are shaped three-dimensionally to optimize a pumping capability of the micro-porous and to optimize flow resistance in the macro-pores of the porous pillars.

FIG. 9 shows one possible embodiment of a manufacturing method. However, when the vapor chamber 20 or at least parts of it are manufactured with an additive manufacturing processes, there may be other printing steps or solely one printing step at all. These one or more printing steps may depend on the printing orientation of the piece in the printer and/or the chosen laser path. Layers may be printed in succession on top each another, and within each layer the laser path may be programmed to follow a certain pattern. A best laser path may not be determined in advance, it may depend on the part functionalities and the engineer know-how.

When the porous pillars 50 are formed by additive manufacturing, an energy beam having a given energy, e.g. the above second energy, may be targeted at a surface of a feedstock of loose metal powder grains over an expanse of the porous pillars 50 to heat near-surface grains forming the porous pillars 50 to a sintering temperature of the metal and fuse the heated grains to the bodies of the porous pillars 50, wherein an energy exposure of the grains forming the body of the porous pillars 50 is limited to a sintering energy density and grains in macro-pores of the porous pillars 50 are circumnavigated by the energy beam. A perforated plate, e.g. the perforated plate 70, e.g. the perforated top plate, may be formed surrounding the porous pillars 50.

In step S10 a top cover, for example the above top cover 26, is provided. The top cover 26 may be provided by forming the top cover 26 by additive manufacturing. If the top cover 26 is formed by additive manufacturing, the top cover 26 may be formed at the same time and/or integrally with the crate elements 30 and/or the porous pillars 50.

When one element out of a group consisting of the bottom cover 24, the crate elements 30, and/or the top cover 26 is formed by additive manufacturing, the corresponding element may be formed by steering the corresponding energy beam having a given energy, e.g. the above second energy, over an expanse of the corresponding element to heat the near-surface grains forming the element to a melting temperature of the metal and melt the grains to the element, wherein the energy exposure of the grains forming the element equates at least a melting energy density.

A feedstock may be a bed of metal powder grains. The bed may have a flat surface. The feedstock may contain excess material. Unused material of the feedstock may be reusable.

An energy beam may be an electron beam or a laser beam for example. The energy beam may be pointed at the surface. The energy beam may narrow towards the surface. The energy beam may hit the surface in a spot. In particular, the energy beam may be oriented approximately perpendicular to the surface. The energy beam may be steered across the surface in two dimensions. There may also be multiple energy beams targeted at the surface.

A temperature of the grains may be raised by absorbing energy from the energy beam and by heat conduction from heated grains to adjoining colder grains. Grains at the surface may be heated directly by the beam. Grains under the surface may be heated by the beam and/or the heat conduction.

A sintering temperature may be below a melting temperature. The sintering temperature may be dependent on the feedstock material. For a copper material the sintering temperature may be between 700° C. and 1070° C., for an aluminum material the sintering temperature may be between 400° C. and 660° C. At the sintering temperature the grains may be still solid. At the sintering temperature contacting surfaces of the grains may interact on an atomic level and fuse together. Fused particles may be still discernible as individual grains. The fused or sintered grains may have grown together at their contact points.

A sintering energy density may be between 2 J/mm3 and 15 J/mm3. In that range the grains may only reach the sintering temperature. The energy density may be raised slowly to facilitate spreading the energy evenly.

A melting energy density may be between 30 J/mm3 and 70 J/mm3. The melting temperature of a copper material may be between 900° C. and 2500° C. The melting temperature of an aluminum material may be between 500° C. and 2400° C.

The above vapor chamber 20 may be defined by the CAD model. The vapor chamber 20 may be two- or three-dimensional. The CAD model may be sliced into two-dimensional layers. In each layer the vapor chamber 20 may have a cross-section area defined by the CAD model. An expanse of the vapor chamber 20 may be equivalent to the cross-section area. The expanse may be defined by borders of the cross-section area. The layers of micro-porous bodies, i.e. the porous pillars 50, may be embedded in loose feedstock material during the production process. The loose feedstock grains in the macro-pores are removed after the grains forming the body have fused after the sinter process.

In step S12 the vapor chamber 20 is finished and may be removed from the device for manufacturing the vapor chamber 20, e.g. the 3D-printer.

While the disclosure has been illustrated and described in detail in the drawings and foregoing description, such illustration and description are to be considered illustrative or exemplary and not restrictive; the disclosure is not limited to the disclosed embodiments. Other variations to the disclosed embodiments can be understood and effected by those skilled in the art and practicing the claimed disclosure, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

What is claimed is:

1. A vapor chamber for cooling an electronic component, the vapor chamber comprising:
   a bottom cover for receiving waste heat from the electronic component;
   a top cover, which is arranged on the bottom cover, wherein the bottom cover and the top cover are formed such that a vapor cavity for accommodating a liquid is formed between the bottom cover and the top cover;
   a crate element for providing mechanical strength to the vapor chamber, wherein the crate element has at least one compartment, which is formed by at least three side panels being connected to each other and extending from the bottom cover to the top cover, and a top recess facing the top cover and a bottom recess facing the bottom cover; and
   at least one porous pillar for transferring the liquid from the top cover to the bottom cover, wherein the porous pillar is arranged in the compartment and extends from the bottom cover through the bottom recess and the top recess to the top cover,
   wherein a cross section area of the porous pillar is smaller than a cross section area of the compartment such that an open channel for guiding the liquid from the top cover to the bottom cover is formed between the at least one porous pillar and at least one of the side panels of the compartment.

2. The vapor chamber according to claim 1, wherein the porous pillar is arranged at least one of the side panels.

3. The vapor chamber according to claim 1, wherein the compartment is formed by at least four side panels.

4. The vapor chamber according to claim 1, wherein at least one of the side panels has a side recess.

5. The vapor chamber according to claim 1, wherein the porous pillar has a polygonal cross section.

6. The vapor chamber according to claim 1, wherein:
   the crate element comprises an array of corresponding compartments,
   adjacent compartments share at least one of their side panels, and
   at least one corresponding porous pillar is arranged in each of the compartments.

7. The vapor chamber according to claim 1, further comprising:
   an array of corresponding crate elements, with corresponding porous pillars being arranged in the corresponding compartments.

8. The vapor chamber according to claim 1, further comprising:
   at least one perforated plate, which is parallel to the bottom cover or parallel to the top cover and which has at one plate recess for each crate element, with each crate element being arranged in and extending through the corresponding plate recess.

9. The vapor chamber according to claim 1, wherein the top cover comprises at least one top chamber, which extends in direction away from the bottom cover and which forms a top cavity, wherein the top cavity communicates with the vapor chamber for exchanging liquid and/or vapor.

10. The vapor chamber according to claim 9, wherein the top cover comprises at least two corresponding top chambers, and wherein outer walls of the top chambers are connected to each other by at least one cooling rib.

11. An electronic arrangement comprising:
    an electronic component, which generates heat while being operated; and
    a vapor chamber comprising:
      a bottom cover for receiving waste heat from the electronic component;
      a top cover, which is arranged on the bottom cover, wherein the bottom cover and the top cover are formed such that a vapor cavity for accommodating a liquid is formed between the bottom cover and the top cover;
      a crate element for providing mechanical strength to the vapor chamber, wherein the crate element has at least one compartment, which is formed by at least three side panels being connected to each other and extending from the bottom cover to the top cover, and a top recess facing the top cover and a bottom recess facing the bottom cover; and
      at least one porous pillar for transferring the liquid from the top cover to the bottom cover, wherein the porous pillar is arranged in the compartment and extends from the bottom cover through the bottom recess and the top recess to the top cover,
      wherein the bottom cover of the vapor chamber is in thermal contact with the electronic component for cooling the electronic component, and wherein the top cover of the vapor chamber is arranged facing away from the electronic component, and
      wherein a cross section area of the porous pillar is smaller than a cross section area of the compartment such that an open channel for guiding the liquid from the top cover to the bottom cover is formed between the at least one porous pillar and at least one of the side panels of the compartment.

12. A method for manufacturing a vapor chamber for cooling an electronic component, the method comprising:
    providing a bottom cover for receiving waste heat from the electronic component;
    forming a crate element for providing mechanical strength to the vapor chamber on the bottom cover by additive manufacturing using a first energy input, wherein the crate element has at least one compartment, which is formed by at least three side panels connected to each other and which has a top recess and a bottom recess, which faces the bottom cover;
    forming at least one porous pillar on the bottom cover in the compartment by additive manufacturing using a second energy input, wherein the first energy input is greater than the second energy input; and
    providing a top cover on the bottom cover, the crate element, and the porous pillar such that a vapor cavity for accommodating a liquid is formed between the bottom cover and the top cover, that the crate element and the porous pillar are arranged in the vapor cavity, and that the compartment and the porous pillar extend from the bottom cover to the top cover, with the top recess of the compartment facing the top cover.

13. The method according to claim 12, wherein providing the bottom cover further comprises forming the bottom cover by additive manufacturing.

14. The method according to claim 12, wherein providing the top cover further comprises forming the top cover by additive manufacturing.

* * * * *